(12) United States Patent
Yu et al.

(10) Patent No.: US 7,378,724 B2
(45) Date of Patent: May 27, 2008

(54) CAVITY STRUCTURE FOR SEMICONDUCTOR STRUCTURES

(75) Inventors: Hsiu-Mei Yu, HsinChu (TW); Gil Huang, Hsinchu (TW); Chien-Tung Yu, Hsin-Chu (TW); Owen Chen, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 117 days.

(21) Appl. No.: 11/166,454

(22) Filed: Jun. 24, 2005

(65) Prior Publication Data

US 2006/0213804 A1 Sep. 28, 2006

Related U.S. Application Data

(60) Provisional application No. 60/664,876, filed on Mar. 24, 2005.

(51) Int. Cl.
*H01L 23/02* (2006.01)
(52) U.S. Cl. .................. 257/685; 257/704; 257/433
(58) Field of Classification Search ............... 257/433, 257/704
See application file for complete search history.

(56) References Cited

U.S. PATENT DOCUMENTS

| | | | |
|---|---|---|---|
| 6,204,454 B1 * | 3/2001 | Gotoh et al. | 174/255 |
| 6,214,717 B1 | 4/2001 | Lan et al. | |
| 6,566,745 B1 | 5/2003 | Beyne et al. | |
| 6,590,269 B1 * | 7/2003 | Chuang et al. | 257/432 |
| 6,635,941 B2 * | 10/2003 | Suda | 257/431 |
| 6,679,964 B2 * | 1/2004 | Lee et al. | 156/182 |
| 6,759,276 B1 | 7/2004 | Hsu et al. | |
| 6,777,767 B2 | 8/2004 | Badehi | |
| 6,838,765 B2 * | 1/2005 | Hyodo et al. | 257/704 |
| 7,074,638 B2 * | 7/2006 | Maeda et al. | 438/75 |

* cited by examiner

*Primary Examiner*—Leonardo Andujar
*Assistant Examiner*—Krista Soderholm
(74) *Attorney, Agent, or Firm*—Slater & Matsil, L.L.P.

(57) ABSTRACT

A method for providing a cavity structure on a semiconductor device is provided. The method of forming the cavity structure, which may be particularly useful in packaging an image sensor, includes forming a spacer layer over a substrate. The spacer layer may be formed from a photosensitive material which may be patterned using photolithography techniques to form cavity walls surrounding dies on the wafer. A packaging layer, such as a substantially transparent layer, may be placed directly upon the cavity walls prior to curing. In another embodiment, the cavity walls are cured, an adhesive is applied to a surface of the cavity walls, and the packaging layer placed upon the adhesive. Thereafter, the wafer may be diced and the individual dies may be packaged for use.

16 Claims, 7 Drawing Sheets

CAVITY STRUCTURE FOR SEMICONDUCTOR STRUCTURES

This application claims the benefit of U.S. Provisional Application Ser. No. 60/664,876 filed on Mar. 24, 2005, entitled Cavity Structure for Semiconductor Structures, which application is hereby incorporated herein by reference.

TECHNICAL FIELD

The present invention relates generally to semiconductor structures, and more particularly, to packaging semiconductor structures having a cavity formed therein.

BACKGROUND

Generally, semiconductor chips used in electronic devices comprise a semiconductor die mounted on a carrier or a substrate. The semiconductor die is manufactured using standard semiconductor fabrication processes and has a series of bond pads that are used to make electrical contact to the integrated circuit formed therein. The die is placed on a carrier or substrate that has electrical leads formed therein to correspond to the bond pads of the die. Solder balls may be used to attach the die to the substrate. The die and the carrier may be enclosed to protect the die from the environment.

In some situations, particularly with complementary metal-oxide semiconductor (CMOS) image sensors, it is preferred that a cavity be formed over some of the circuitry. Generally, CMOS image sensors utilize light-sensitive CMOS circuitry to convert light energy into electrical energy. The light-sensitive CMOS circuitry typically comprises a photo-diode formed in a silicon substrate. As the photo-diode is exposed to light, an electrical charge is induced in the photo-diode. The photo-diode is typically coupled to a MOS switching transistor, which is used to sample the charge of the photo-diode. Colors may be determined by placing filters over the light-sensitive CMOS circuitry.

After the CMOS image sensors and related circuitry have been formed, the CMOS image sensors are packaged by placing a packaging layer over the wafer on which the CMOS image sensors are formed. Prior to placing the packaging layer over the wafer, which is typically formed of a transparent material such as glass, a spacer material, such as an epoxy, is formed and patterned on the packaging layer. The packaging layer is then aligned and affixed to the substrate to form a combined substrate. Thereafter, the combined substrate may be diced to separate the individual dies and individually package as required by the particular application requirements. An optical epoxy typically fills any voids between the packaging layer and the wafer.

This method of packaging CMOS image sensors, however, may be difficult to control. In particular, the spacer material formed on the packaging layer must be precisely aligned with the individual die. Any misalignment may cause the device to fail, thereby reducing yields and increasing costs. Accordingly, there is a need for an efficient and effective method to package a semiconductor structure having a cavity.

SUMMARY OF THE INVENTION

These and other problems are generally solved or circumvented, and technical advantages are generally achieved, by preferred embodiments of the present invention which provides a method of packaging a semiconductor structure such that a cavity is formed therein.

In accordance with an embodiment of the present invention, a method of packaging a semiconductor structure is provided. The method includes forming cavity walls on a wafer, wherein the wafer having one or more dies formed thereon. The cavity walls are preferably formed by depositing, exposing, and developing a photo-sensitive epoxy material.

In an embodiment, a packaging layer, such as a transparent glass layer, is placed on the cavity walls prior to the cavity walls curing.

In another embodiment, the cavity walls are allowed to cure. Thereafter, an adhesive material is placed on the cavity walls and the packaging layer is placed on the adhesive material.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention are described in the context of packaging a CMOS image sensor, which is one application of the present invention that has been found to be particularly useful. Embodiments of the present invention, however, may be used to package other types of devices.

Figure 1:
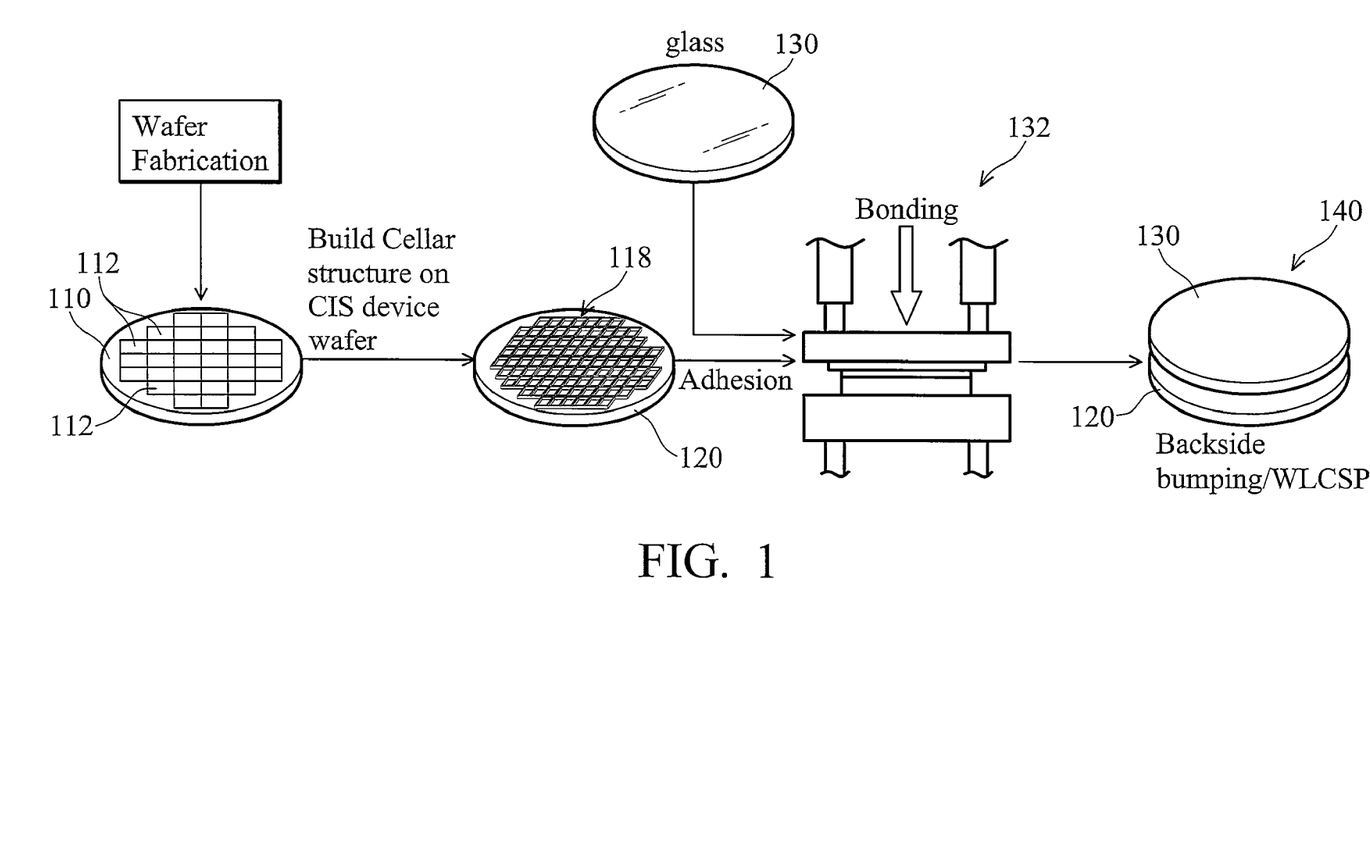
FIG. 1 is a process figure illustrating a method of affixing a packaging layer to a wafer in accordance with an embodiment of the present invention.

Referring first to FIG. 1, a process of packaging a semiconductor in accordance with an embodiment of the present invention is illustrated. A fabricated wafer 110 includes a plurality of dies 112 and may be fabricated using any suitable technology. Each die 112 typically represents a complete electronic circuit that is to be packaged to form a semiconductor chip. It should be noted that not all of the dies on the fabricated wafer 110 are labeled.

In the case in which CMOS image sensors are being fabricated, each die 112 of the fabricated wafer 110 may include an array of photo-sensitive elements (not shown), which may comprise any element that generates an electrical current upon being exposed to light energy. For example, the photo-sensitive element may be a photo-diode formed by implanting impurities via an ion implant in a substrate. Other circuitry (such as access transistors, reset transistors, capacitors, lenses, color filters, etc.) may also be included to control the functions of the photo-sensitive elements.

A cavity structure 118 is formed on the fabricated wafer 110 to form a prepared wafer 120. As will be described in greater detail below, the cavity structure 118 may be formed, for example, by depositing an optical-sensitive material and patterning the optical-sensitive material in accordance with known photolithography techniques.

Thereafter, a packaging layer 130 may be bonded to the prepared wafer 120 in a bonding apparatus 132. The packaging layer 130 is preferably formed of a transparent material such as glass. It should be noted that in accordance with embodiments of the present invention, the cavity structure 118 is formed on the wafer itself (e.g., the fabricated wafer 110) as opposed to the packaging layer 130 as performed in typical prior art systems. By forming the cavity structure 118 on the fabricated wafer 110 instead of the packaging layer 130, the risk of misalignment is reduced or removed, thereby increasing yields and decreasing costs.

After the packaging layer 130 is affixed to the prepared wafer 120, the resulting packaged wafer 140 may be diced and the individual dies may be individually packaged and prepared for use in accordance with known processing techniques.

Figure 2A:
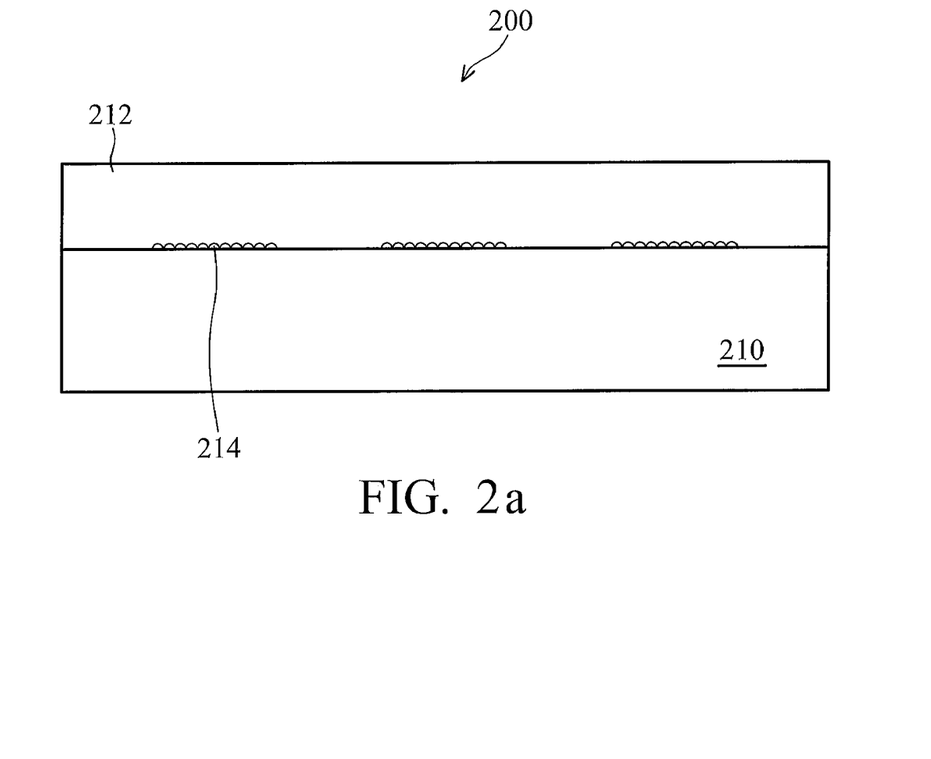
FIGS. 2a-2d are cross-section views of various process steps of applying a packaging layer to a wafer in accordance with first embodiment of the present invention.

FIGS. 2a-2d are cross-section views after various process steps have been performed to illustrate a method of forming a cavity structure on a wafer in accordance with a first embodiment of the present invention. Referring first to FIG. 2a, a wafer 200 is shown having a substrate 210 and a spacer layer 212. In an embodiment, the substrate 210 comprises a substrate, which may be formed of silicon, germanium, silicon germanium, graded silicon germanium, semiconductor-on-insulator, carbon, quartz, sapphire, glass, or the like, having circuitry formed thereon. In a typical application, it is expected that the substrate 210 will include multiple layers of circuitry and conductive lines separated by inter-layer dielectrics.

In an embodiment in which the substrate includes CMOS image sensors, the substrate 210 may include microlenses 214 as illustrated in FIG. 2a. Typically, the microlenses are arranged in an array of rows and columns, such as 1024×768 pixels. Each pixel is represented by at least one photo-sensitive component. In applications requiring the capture of color, color filters may be used to capture the specific colors of the received light, and each pixel may be represented by more than one photo-sensitive component. Generally, a microlens guides the light to the photo-sensitive component, essentially acting as the collection point for the digital imaging system.

The spacer layer 212 is preferably formed of an epoxy-based photoresist material, such as SU-8 photoresist available from MicroChem Corp. of Newton, Mass., USA, and is preferably greater than about 200 µm in thickness. Other materials may be used. The spacer layer 212 may be formed by sliding laminated layer or spin coating techniques known in the art.

Figure 2B:
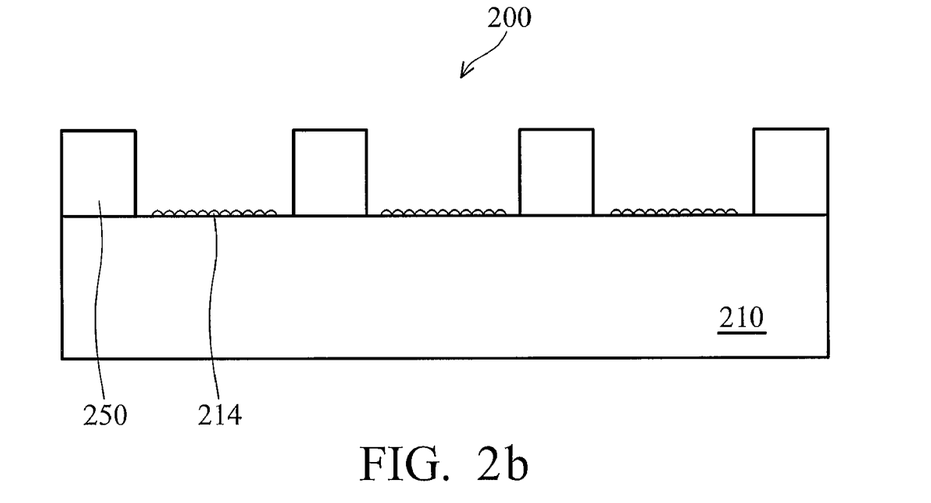

FIG. 2b illustrates the wafer 200 from FIG. 2a after the spacer layer 212 has been patterned in accordance with an embodiment of the present invention. As discussed above, the spacer layer 212 is preferably formed of an epoxy-based photoresist. In this embodiment, the spacer layer 212 may be patterned using standard photolithography techniques known in the art. Generally, photolithography involves depositing a photoresist material, which is then masked and exposed in accordance with a desired pattern. After the photoresist material is exposed, the photoresist material is developed to remove unwanted portions of the photoresist material.

In this situation, the spacer layer 212 is masked and exposed such that when the spacer layer 212 is developed, the remaining material of the spacer layer 212 forms cavity walls 250. (See FIG. 2e for a perspective view of the cavity walls 250.) The cavity walls 250 are preferably greater than about 10 um in height, but more preferably about 10 um to about 60 µm in height, and are preferably greater than 20 um in width, but more preferably about 50 un to 200 µm in width. To further enhance adhesion property, an inner surface (e.g., the top surface) of the cavity wall 250 can be treated to form surface roughness by performing a plasma treatment, chemical surface treatment, other physical and/or chemical treatment, or the like. The surface roughness is preferably greater than 0.5 um.

Figure 2C:
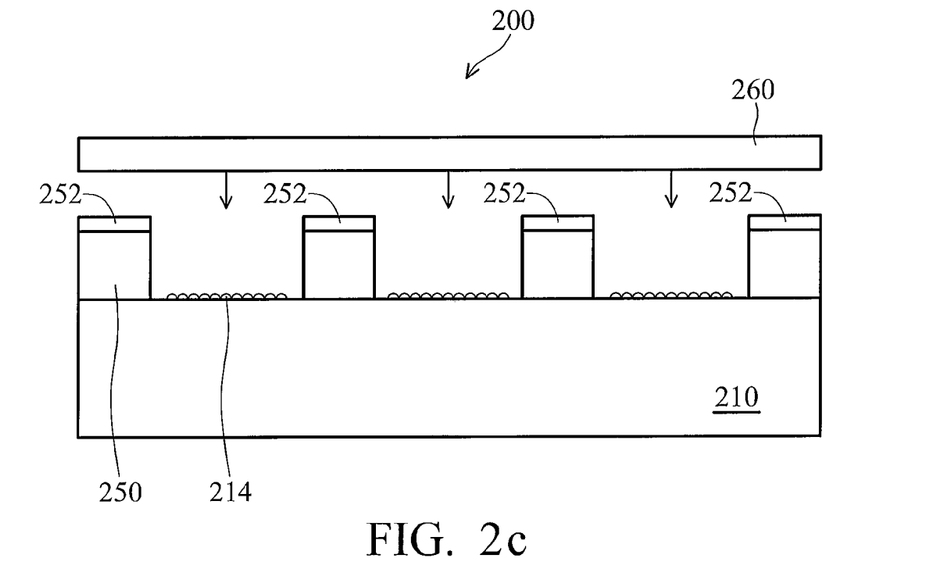

FIG. 2c illustrates the wafer 200 from FIG. 2b as a packaging layer 260 is being applied thereto. In an embodiment, the packaging layer 260 comprises an optical transparent layer, such as a layer of silicon oxide. The packaging layer is preferably greater than about 300 µm in thickness.

As illustrated in FIG. 2c, the packaging layer 260 is placed on top of the cavity walls 250. Because the cavity walls 250 have been formed on the substrate, the packaging layer 260 does not need to be critically aligned as in prior art methods.

In an embodiment, the epoxy-based photoresist material, from which the cavity walls 250 are formed, are allowed to cure prior to affixing the packaging layer 260 to the substrate 210. The curing process preferably comprises a thermal curing process and/or an electromagnetic radiation curing process. In an embodiment, the curing may be performed at a temperature between about 50° C. and about 500° C. in an ambient comprising air, $N_2$, $O_2$, or the like, for about 10 mm to about 120 mm. In this embodiment, the packaging layer 260 may be affixed to the cavity walls 250 by applying an adhesive paste 252 (preferably using a screen printing process) to the cavity walls and placing the packaging layer 260 upon the cavity walls 250. The adhesive paste may comprise an epoxy material, UV glue, or the like. A bonding apparatus known in the art may be used to perform this process. A curing process may be performed after placing the packaging layer 260 upon the cavity walls 250.

In an alternative embodiment, a material that exhibits good adhesive properties may be used to form the cavity walls 250. In this manner, the packaging layer 260 may be placed directly upon the cavity walls 250 prior to the cavity walls 250 curing. A curing process may be performed thereafter. In an embodiment, the curing may be performed at a temperature between about 50° C. and about 500° C. in an ambient comprising air, $N_2$, $O_2$, or the like, for about 10 min to about 120 min. Materials such as an epoxy-based series, a polyimide series, a phenol series, an acrylic series, a novolak series, a benzocyclobutenes (BCB) series, a polybenzoxazoles (PBO) series, a polynorbornene series, or the like photo-resist may be used to form the cavity walls 250 in this embodiment.

Figure 2D:
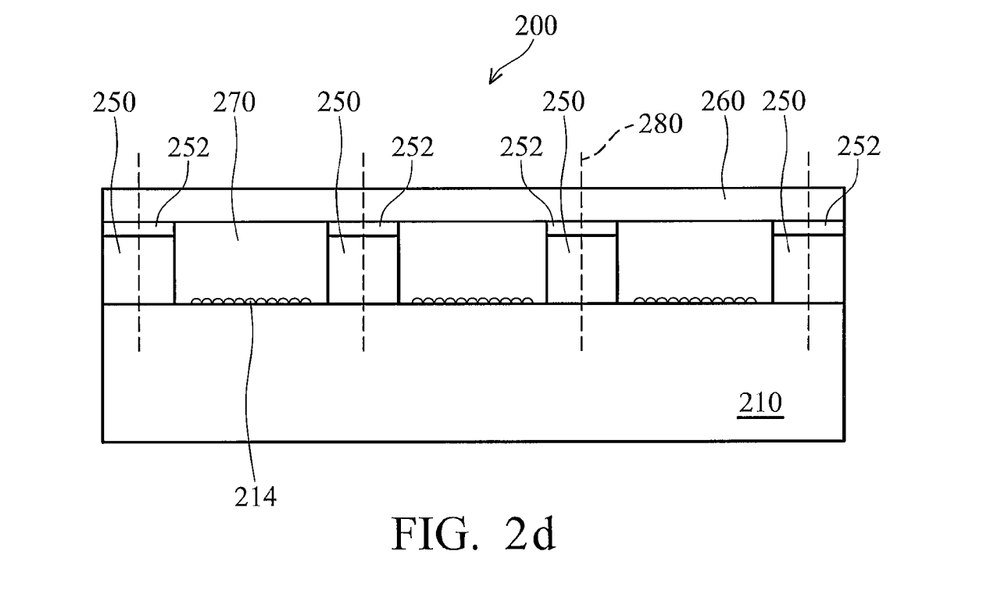
Figure 2E:
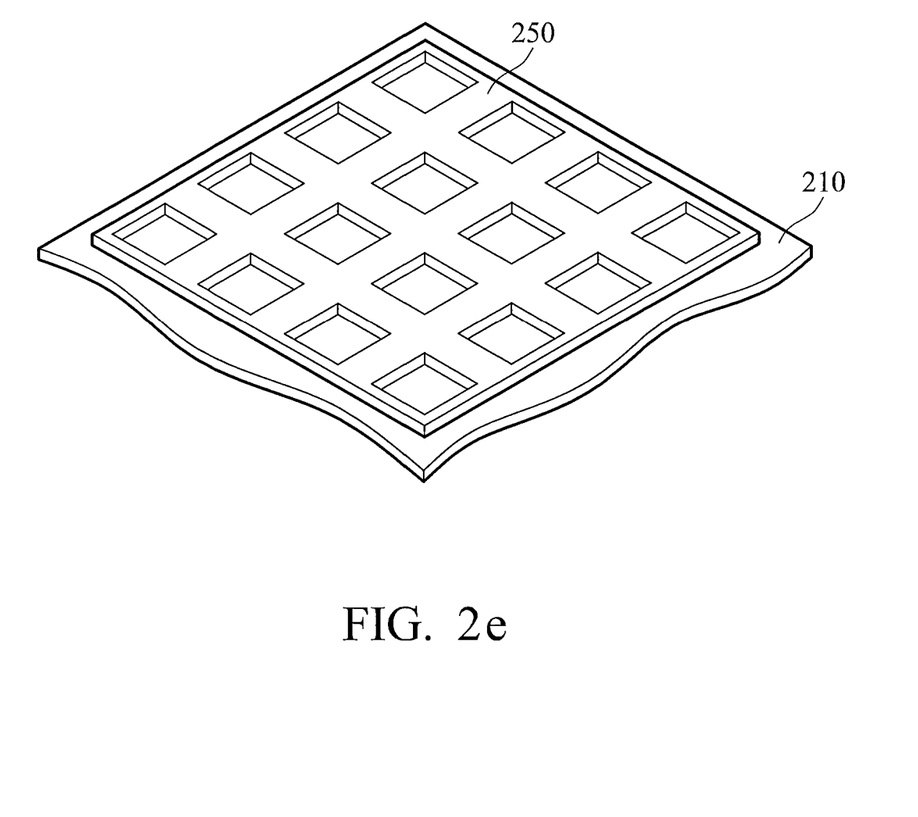
FIG. 2e is a perspective view of cavity walls being formed on a wafer in accordance with the first embodiment of the present invention.

FIG. 2d illustrates the wafer 200 from FIG. 2c after a packaging layer 260 has been positioned over the substrate 210 in accordance with an embodiment of the present invention. It should be noted that the resulting configuration has an air cavity 270. The cavity may, however, be filled with an optical epoxy, but it has been found that an air cavity may exhibit better light transmission properties for a CMOS image sensor.

Thereafter, the wafer 200 may be diced to separate the individual dies. Preferably, the wafer 200 is diced along the scribe lines indicated by the vertical dotted lines 280. It should be noted that the cavity walls 250 form a seal to prevent or reduce contaminants from reaching the air cavity 270. Contaminants within the air cavity 270 may adversely affect the performance of the underlying CMOS image sensor.

As discussed above, FIG. 2e is a perspective view of cavity walls that may be formed in accordance with an embodiment of the present invention. It should be noted, however, that the shape of the cavity walls are shown as rectangular for illustrative purposes only. Accordingly, the shape of the cavity walls may be changed to any suitable design while remaining within the scope of the present invention. For example, the shape of the cavity walls may be square, circular, oval, any other polygonal shape, or the like.

FIGS. 3a-3d cross-section views after various process steps have been performed to illustrate a method of forming a cavity structure on a wafer in accordance with a second embodiment of the present invention. FIGS. 3a-3d are similar to FIGS. 2a-2d, respectively, except that the shape of the cavity walls 250 are different. For example, compare FIGS. 2b and 2e with FIGS. 3b and 3e, respectively. Accordingly, like reference numerals in FIGS. 2a-2d and FIGS. 3a-3d refer to like elements.

Figure 3A:
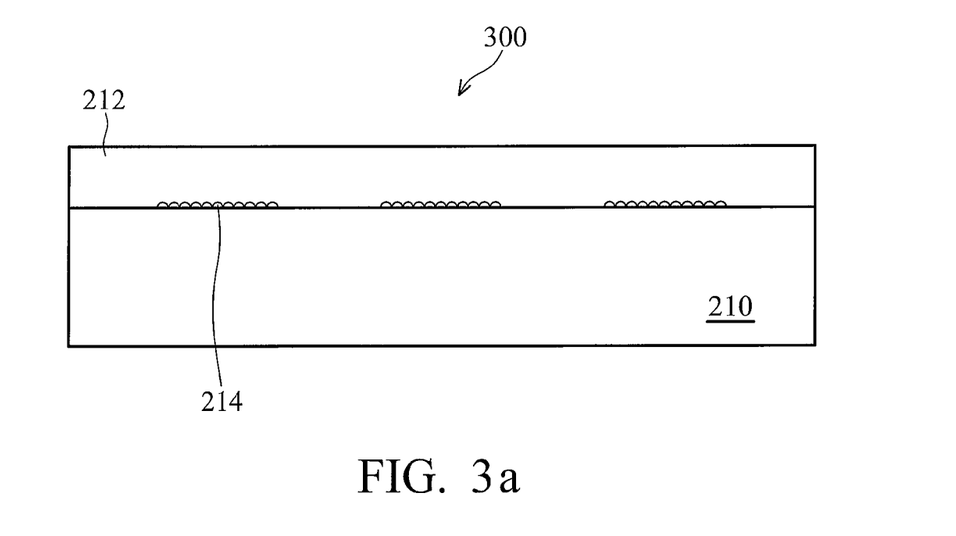
FIGS. 3a-3d are cross-section views of various process steps of applying a packaging layer to a wafer in accordance with a second embodiment of the present invention.

Referring first to FIG. 3a, a wafer 300 is shown having a substrate 210 and a spacer layer 212, both of which may be formed in a similar manner as discussed above with reference to FIG. 2a. Next, in FIG. 3b, the spacer layer 212 has been patterned in accordance with an embodiment of the present invention to form cavity walls 350. In this second embodiment, the cavity walls 350 surrounding the microlenses 214 on a first die are separated from the cavity walls 350 surrounding the microlenses 214 on a second die.

Figure 3B:
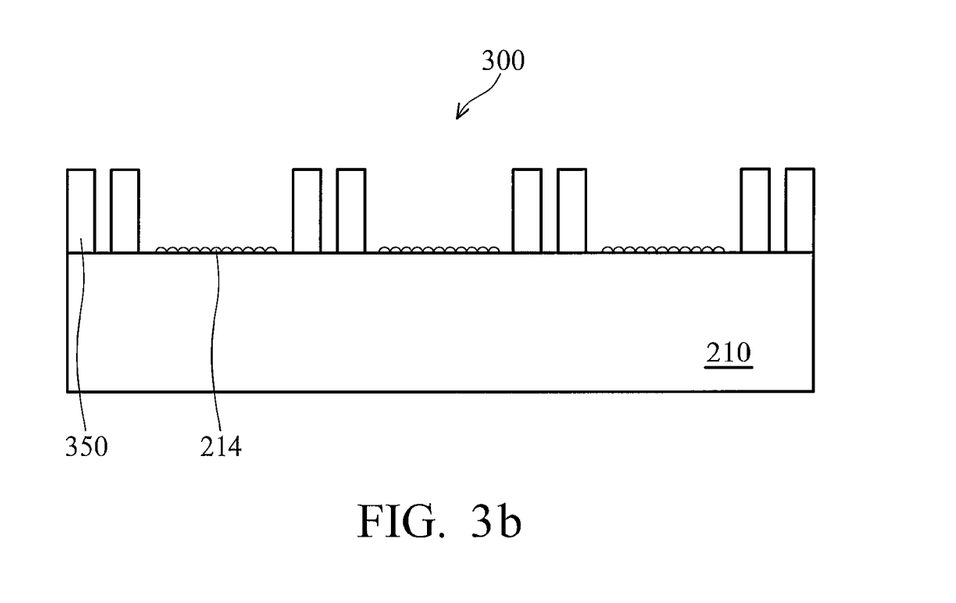

As discussed above, the spacer layer 212 is preferably formed of an epoxy-based photoresist and may be patterned using standard photolithography techniques known in the art as described above with reference to FIG. 2b. To further enhance adhesion property, an inner surface (e.g, the top surface) of the cavity wall 350 can be treated to form surface roughness by performing a plasma treatment, chemical surface treatment, other physical and/or chemical treatment, or the like. The surface roughness is preferably greater than 0.5 um.

Figure 3C:
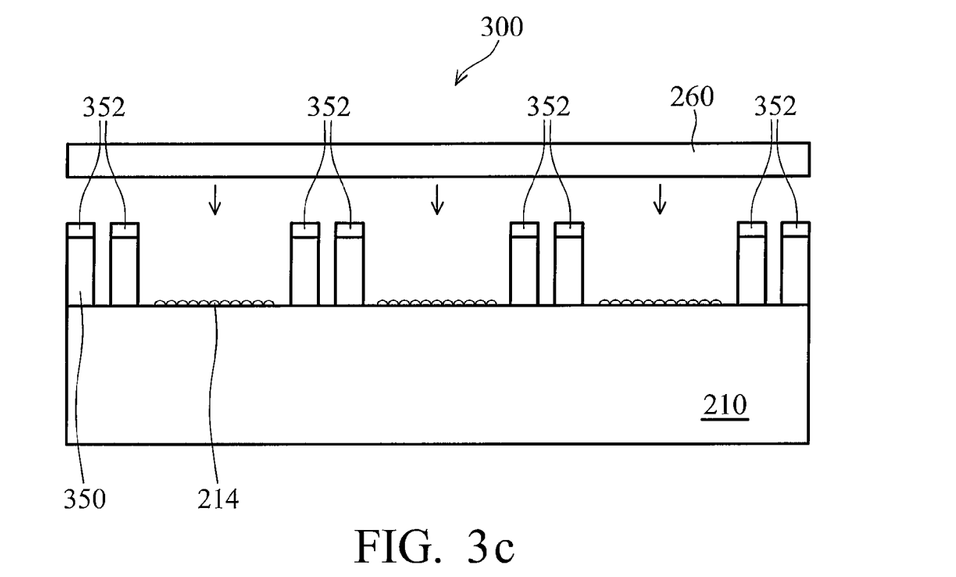

FIG. 3c illustrates the wafer 300 from FIG. 3b as a packaging layer 260 is being applied thereto. In an embodiment, the epoxy-based photoresist material, from which the cavity walls 350 are formed, are allowed to cure prior to affixing the packaging layer 260 to the substrate 210. The curing process preferably comprises a thermal curing process and/or an electromagnetic radiation curing process. In an embodiment, the curing may be performed at a temperature between about 50° C. and about 500° C. in an ambient comprising air, $N_2$, $O_2$, or the like, for about 10 mm to about 120 mm. In this embodiment, the packaging layer 260 may be affixed to the cavity walls 350 by applying an adhesive paste 352 (preferably using a screen printing process) to the cavity walls and placing the packaging layer 260 upon the cavity walls 350. The adhesive paste may comprise an epoxy material, UV glue, or the like. A bonding apparatus known in the art may be used to perform this process. A curing process may be performed after placing the packaging layer 260 upon the cavity walls 350.

In an alternative embodiment, a material that exhibits good adhesive properties may be used to form the cavity walls 350. In this manner, the packaging layer 260 may be placed directly upon the cavity walls 350 prior to the cavity walls 350 curing. A curing process may be performed thereafter. In an embodiment, the curing may be performed at a temperature between about 50° C. and about 500° C. in an ambient comprising air, $N_2$, $O_2$, or the like, for about 10 min to about 120 min. Materials such as an epoxy-based series, a polyimide series, a phenol series, an acrylic series, a novolak series, a benzocyclobutenes (BCB) series, a polybenzoxazoles (PBO) series, a polynorbornene series, or the like photo-resist may be used to form the cavity walls 250 in this embodiment.

Figure 3D:
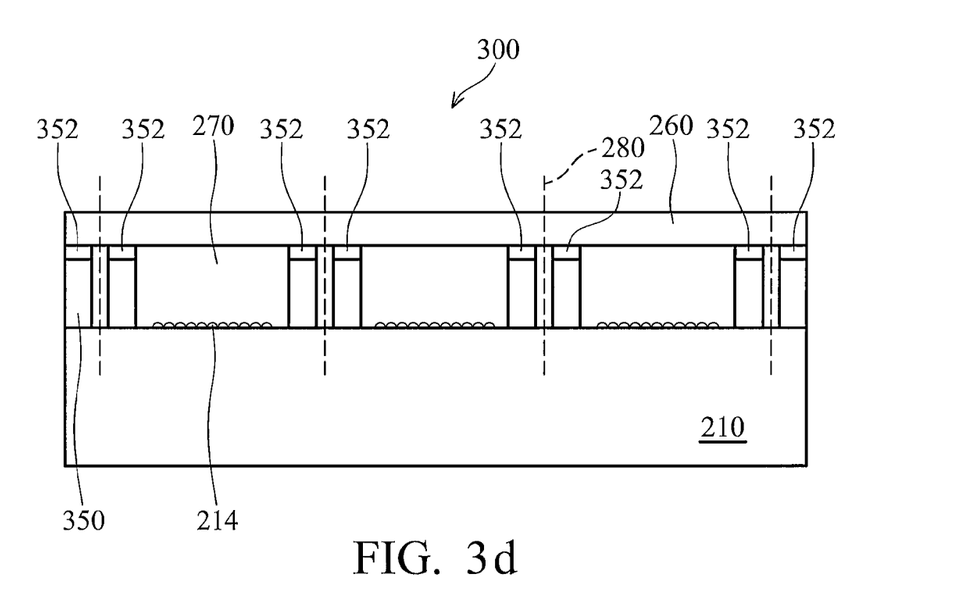
Figure 3E:
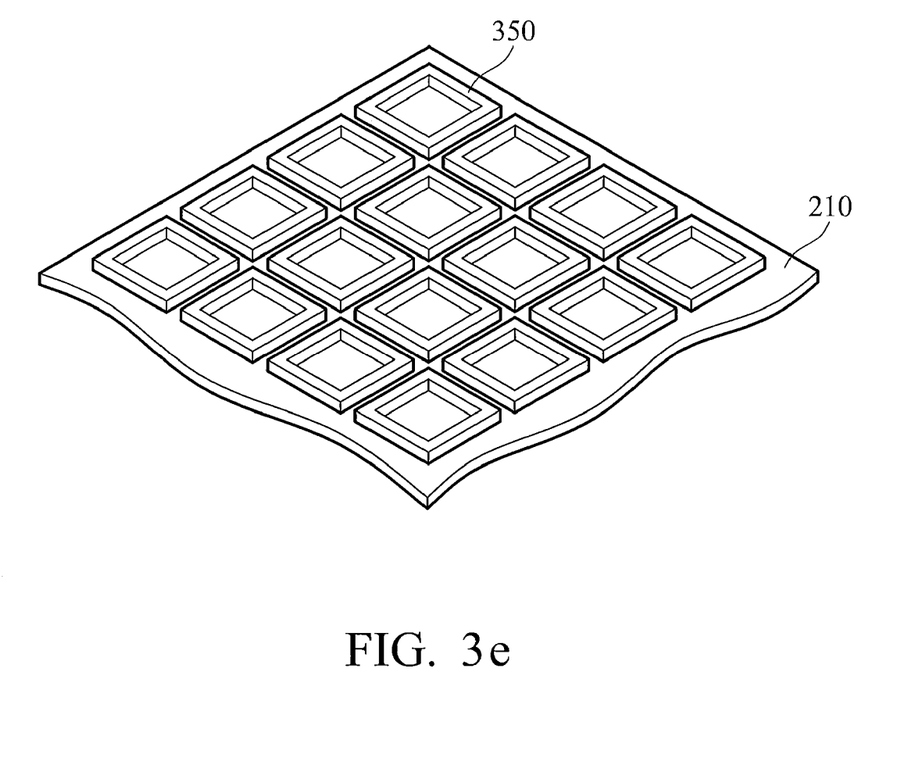
FIG. 3e is a perspective view of cavity walls being formed on a wafer in accordance with the second embodiment of the present invention.

FIG. 3d illustrates the wafer 300 from FIG. 3c after a packaging layer 260 has been positioned over the substrate 210 in accordance with an embodiment of the present invention. It should be noted that the resulting configuration has an air cavity 270. The cavity may, however, be filled with an optical epoxy, but it has been found that an air cavity may exhibit better light transmission properties for a CMOS image sensor.

Thereafter, the wafer 200 may be diced to separate the individual dies. Preferably, the wafer 200 is diced along the scribe lines indicated by the vertical dotted lines 280. In this second embodiment, the scribe lines 280 are preferably position between adjacent cavity walls 350. It should be noted that the cavity walls 350 form a seal to prevent or reduce contaminants from reaching the air cavity 270. Contaminants within the air cavity 270 may adversely affect the performance of the underlying CMOS image sensor.

As discussed above, FIG. 3e is a perspective view of cavity walls that may be formed in accordance with an embodiment of the present invention. It should be noted, however, that the shape of the cavity walls are shown as rectangular for illustrative purposes only. Accordingly, the shape of the cavity walls may be changed to any suitable design while remaining within the scope of the present invention. For example, the shape of the cavity walls may be square, circular, oval, any other polygonal shape, or the like.

Although the present invention and its advantages have been described in detail, it should be understood that various changes, substitutions and alterations can be made herein without departing from the spirit and scope of the invention as defined by the appended claims. For example, different types of materials and processes may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a semiconductor die having an image sensor formed thereon;
   at least one cavity wall physically contacting the semiconductor die and being positioned around the image sensor forming a cavity, an inner surface of the cavity wall facing inward toward a middle area of the cavity having a surface roughness of more than about 0.5 μm;
   an adhesive layer on the cavity wall; and
   a sealing layer over the semiconductor die, the sealing layer contacting the adhesive layer.

2. The semiconductor device of claim 1, wherein the sealing layer greater than about 300 μm in thickness.

3. The semiconductor device of claim 1, wherein the adhesive layer comprises an epoxy or a UV glue.

4. The semiconductor device of claim 1, wherein a height of the cavity wall is greater than about 10 μm.

5. The semiconductor device of claim 1, wherein a width of the cavity wall is greater than about 20 μm.

6. A semiconductor device comprising:
   a substrate having a plurality of semiconductor dies;
   a sealing layer positioned over all semiconductor dies on the substrate; and
   at least one cavity wall positioned between the plurality of semiconductor dies and the sealing layer, the cavity wall physically contacting the plurality of semiconductor dies and the sealing layer, wherein an inner surface of the cavity wall has a surface roughness of more than about 0.5 μm.

7. The semiconductor device of claim 6, wherein the sealing layer comprises a substantially optical transparent layer.

8. The semiconductor device of claim 7, wherein the optical transparent layer is greater than about 300 μm in thickness.

9. The semiconductor device of claim 7, wherein a height of the cavity wall is greater than about 10 μm.

10. The semiconductor device of claim 6, wherein a width of the cavity wall is greater than about 20 μm.

11. The semiconductor device of claim 6, wherein the plurality of semiconductor dies comprises a CMOS image sensor or a Charge Coupled Device.

12. A semiconductor device comprising:
    a semiconductor die having one or more microlenses formed thereon;
    a substantially uniform sealing layer; and
    a cavity wall positioned between the semiconductor die and the sealing layer, the cavity wall physically contacting the semiconductor die and the sealing layer, wherein the cavity wall and the sealing layer substantially enclose the microlenses formed on the semiconductor die, wherein an inner surface of the cavity wall has a surface roughness of more than about 0.5 μm.

13. The semiconductor device of claim 12, wherein the sealing layer is greater than about 300 μm in thickness.

14. The semiconductor device of claim 12, wherein a height of the cavity wall is greater than about 10 μm.

15. The semiconductor device of claim 12, wherein a width of the cavity wall is greater than about 20 μm.

16. The semiconductor device of claim 12, further comprising a CMOS image sensor or a Charge Coupled Device formed in the semiconductor die.

* * * * *

UNITED STATES PATENT AND TRADEMARK OFFICE
CERTIFICATE OF CORRECTION

PATENT NO. : 7,378,724 B2 Page 1 of 1
APPLICATION NO. : 11/166454
DATED : May 27, 2008
INVENTOR(S) : Yu et al.

It is certified that error appears in the above-identified patent and that said Letters Patent is hereby corrected as shown below:

In Col. 4, line 47, delete "mm" and insert --min--.
In Col. 4, line 48, delete "mm" and insert --min--.
In Col. 5, line 66, delete "mm" and insert --min--.
In Col. 5, line 67, delete "mm" and insert --min--.
In Col. 7, line 16, after layer insert --is--.
In Col. 8, line 4, delete "7" and insert --6--.

Signed and Sealed this

Twenty-sixth Day of August, 2008

JON W. DUDAS
*Director of the United States Patent and Trademark Office*